United States Patent
Li et al.

(10) Patent No.: US 8,790,957 B2
(45) Date of Patent: Jul. 29, 2014

(54) METHOD OF FABRICATING A BACK-CONTACT SOLAR CELL AND DEVICE THEREOF

(75) Inventors: Bo Li, San Jose, CA (US); David Smith, Campbell, CA (US); Peter Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 443 days.

(21) Appl. No.: 12/972,247

(22) Filed: Dec. 17, 2010

(65) Prior Publication Data

US 2011/0214719 A1 Sep. 8, 2011

Related U.S. Application Data

(60) Provisional application No. 61/310,655, filed on Mar. 4, 2010.

(51) Int. Cl.
*H01L 31/18* (2006.01)

(52) U.S. Cl.
USPC ............. 438/98; 438/558; 438/567; 136/258; 136/261

(58) Field of Classification Search
USPC .................. 136/256–261; 438/83, 96–98
See application file for complete search history.

(56) References Cited

U.S. PATENT DOCUMENTS

| | | | |
|---|---|---|---|
| 5,057,439 A * | 10/1991 | Swanson et al. | 438/98 |
| 5,888,309 A | 3/1999 | Yu | |
| 6,287,961 B1 | 9/2001 | Liu et al. | |
| 8,349,644 B2 * | 1/2013 | Shan et al. | 438/98 |
| 2007/0108229 A1 * | 5/2007 | Fork et al. | 222/129 |
| 2007/0151598 A1 * | 7/2007 | De Ceuster et al. | 136/256 |
| 2007/0235075 A1 * | 10/2007 | Park | 136/252 |
| 2007/0256728 A1 * | 11/2007 | Cousins | 136/252 |
| 2008/0035198 A1 | 2/2008 | Teppe et al. | |
| 2008/0138456 A1 * | 6/2008 | Fork et al. | 425/113 |
| 2009/0308438 A1 | 12/2009 | De Ceuster et al. | |
| 2010/0029039 A1 * | 2/2010 | Shan et al. | 438/98 |

OTHER PUBLICATIONS

International Search Report and Written Opinion from PCT/US2010/062264 mailed Sep. 21, 2011, 9 pgs.
International Preliminary Report on Patentability from PCT/US2010/062264 mailed Sep. 13, 2012, 6 pgs.

* cited by examiner

*Primary Examiner* — Jayne Mershon
(74) *Attorney, Agent, or Firm* — Blakely Sokoloff Taylor Zafman LLP

(57) ABSTRACT

Methods of fabricating back-contact solar cells and devices thereof are described. A method of fabricating a back-contact solar cell includes forming an N-type dopant source layer and a P-type dopant source layer above a material layer disposed above a substrate. The N-type dopant source layer is spaced apart from the P-type dopant source layer. The N-type dopant source layer and the P-type dopant source layer are heated. Subsequently, a trench is formed in the material layer, between the N-type and P-type dopant source layers.

14 Claims, 7 Drawing Sheets

METHOD OF FABRICATING A BACK-CONTACT SOLAR CELL AND DEVICE THEREOF

The invention described herein was made with Governmental support under contract number DE-FC36-07GO17043 awarded by the United States Department of Energy. The Government may have certain rights in the invention.

CROSS-REFERENCE TO RELATED APPLICATIONS

This application claims the benefit of U.S. Provisional Application No. 61/310,655, filed Mar. 4, 2010, the entire contents of which are hereby incorporated by reference herein.

TECHNICAL FIELD

Embodiments of the present invention are in the field of renewable energy and, in particular, methods of fabricating back-contact solar cells and devices thereof.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are connected to metal contacts on the solar cell to direct an electrical current from the cell to an external circuit coupled thereto.

Efficiency is an important characteristic of a solar cell as it is directly related to the solar cell's capability to generate power. Accordingly, techniques for increasing the efficiency of solar cells are generally desirable. Embodiments of the present invention allow for increased solar cell efficiency by providing processes for fabricating novel solar cell structures.

DETAILED DESCRIPTION

Methods of fabricating back-contact solar cells and devices thereof are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithographic techniques, are not described in detail in order to not unnecessarily obscure embodiments of the present invention. Furthermore, it is to be understood that the various embodiments shown in the Figures are illustrative representations and are not necessarily drawn to scale.

Disclosed herein are methods of fabricating back-contact solar cells. In one embodiment, a method includes forming an N-type dopant source layer and a P-type dopant source layer above a material layer disposed above a substrate, the N-type dopant source layer spaced apart from the P-type dopant source layer. The N-type dopant source layer and the P-type dopant source layer are heated. Subsequently, a trench is formed in the material layer, between the N-type and P-type dopant source layers.

Also disclosed herein are back-contact solar cells. In one embodiment, a back-contact solar cell includes a material layer disposed above a substrate. A trench is disposed in the material layer, the trench separating an N-type region and a P-type region of the material layer. The P-type region includes a dopant concentration directly adjacent to the trench approximately equal to a dopant concentration in the center of the P-type region.

In accordance with at least some embodiments of the present invention, solar cells are formed with N-type and P-type regions of absorbing layers, the regions free from features associated with a signature from a "ledge" feature described below in association with FIGS. 2A-2E. In some embodiments, a reduction in the sheer number of process operations is achieved by using process flows described herein, as compared with conventional process flows. In some embodiments, using process flows such as those described in detail herein may be preferable over conventional flows even though some of the process flows described herein include an additional heating or anneal operation.

Figure 1A:
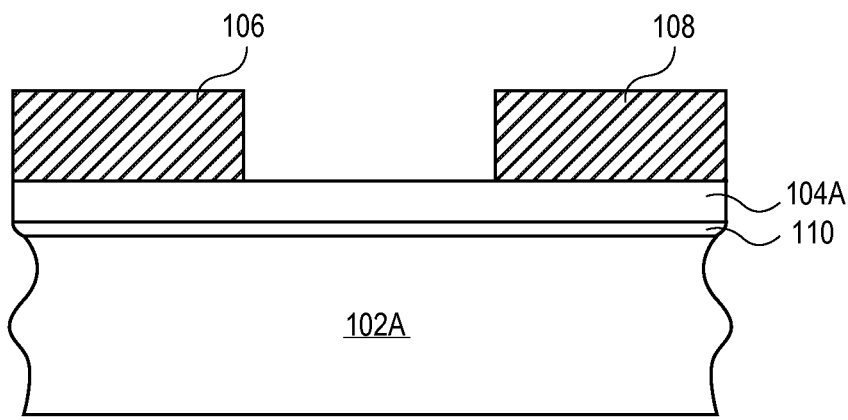
FIG. 1A illustrates a cross-sectional view of a stage in the fabrication of a back-contact solar cell, in accordance with an embodiment of the present invention.
Figure 1B:
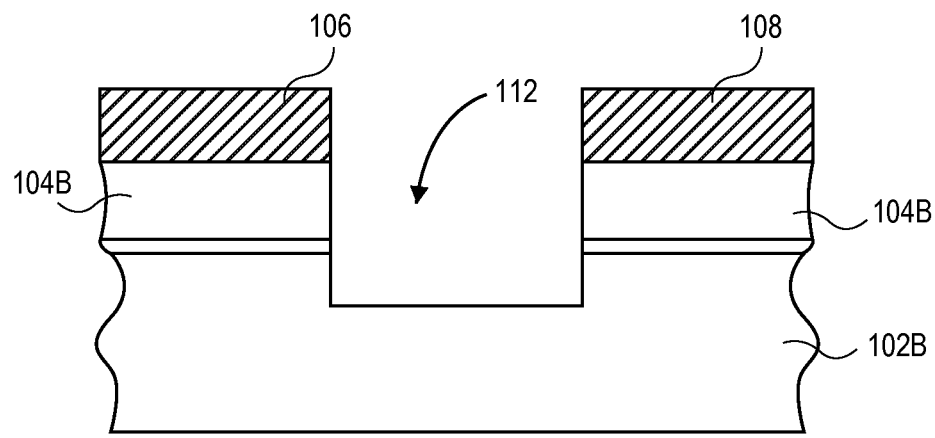
FIG. 1B illustrates a cross-sectional view of a stage in the fabrication of a back-contact solar cell, in accordance with an embodiment of the present invention.
Figure 1C:
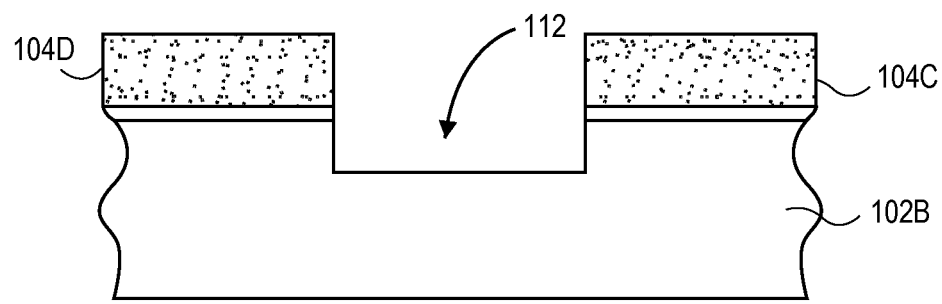
FIG. 1C illustrates a cross-sectional view of a stage in the fabrication of a back-contact solar cell, in accordance with an embodiment of the present invention.

In an aspect of the present invention, it may be desirable to form a solar cell having P-type and N-type absorbing layer regions without signatures resulting from ledge features. FIGS. 1A-1C illustrate cross-sectional views of various stages in the fabrication of a back-contact solar cell, in accordance with an embodiment of the present invention. It is to be understood that the operations of FIGS. 1A-1C are not intended to impose any sort of process order, but rather several high level concepts are to be gleaned from the following discussion of these Figures. More detailed approaches follow the discussion of FIGS. 1A-1C.

Referring to FIG. 1A, a method of fabricating a back-contact solar cell includes forming an N-type dopant source layer 108 and a P-type dopant source layer 106 above a material layer 104A disposed above a substrate 102A. N-type dopant source layer 108 is spaced apart from P-type dopant source layer 106, as depicted in FIG. 1A. Also depicted is a tunnel oxide barrier layer film 110.

Referring to FIG. 1B, the method of fabricating a back-contact solar cell further includes forming a trench 112 through material layer 104A and part way into substrate 102A, between N-type and P-type dopant source layers 108 and 106, respectively, to provide patterned material layer 104B and patterned substrate 102B, respectively.

Referring to FIG. 1C, N-type and P-type dopants are diffused from N-type and P-type dopant source layers 108 and 106, respectively, into patterned material layer 104B to provide N-type-doped material layer region 104C and P-type-doped material layer region 104D, respectively, above patterned substrate 102B. In accordance with an embodiment of the present invention, N-type-doped material layer region 104C and P-type-doped material layer region 104D are doped homogeneously, in that the dopant concentration in each of N-type-doped material layer region 104C and P-type-doped material layer region 104D nearest trench 112 is approximately the same as the dopant concentration near the centers of N-type-doped material layer region 104C and P-type-doped material layer region 104D.

However, it is to be understood that not every approach to forming a solar cell will avoid the formation of signatures of ledge features in a P-type or an N-type region of an absorbing layer of the solar cell. For example, FIGS. 2A-2E illustrate cross-sectional views of various stages in the fabrication of a back-contact solar cell and, in accordance with an embodiment of the present invention, are provided as a comparison for the detailed discussion associated with FIGS. 3, 4 and 5A-5E below.

Figure 2A:
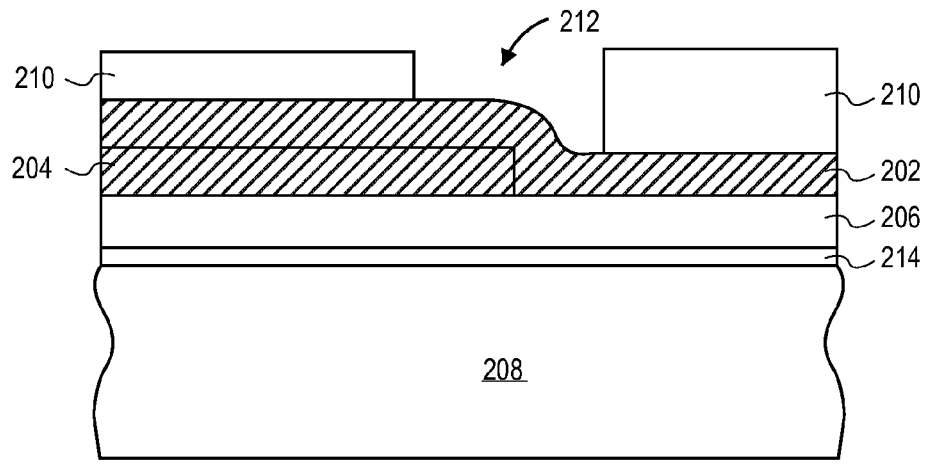
FIG. 2A illustrates a cross-sectional view of a stage in the fabrication of a back-contact solar cell, in accordance with an embodiment of the present invention.

Referring to FIG. 2A, a method of fabricating a back-contact solar cell includes forming an N-type dopant source layer 202 over a patterned P-type dopant source layer 204 and over and exposed portion of a material layer 206 disposed above a substrate 208. A mask 210 is disposed over N-type dopant source layer 202 with a trench pattern 212 included therein. Also depicted is a tunnel oxide barrier layer film 214.

Figure 2B:
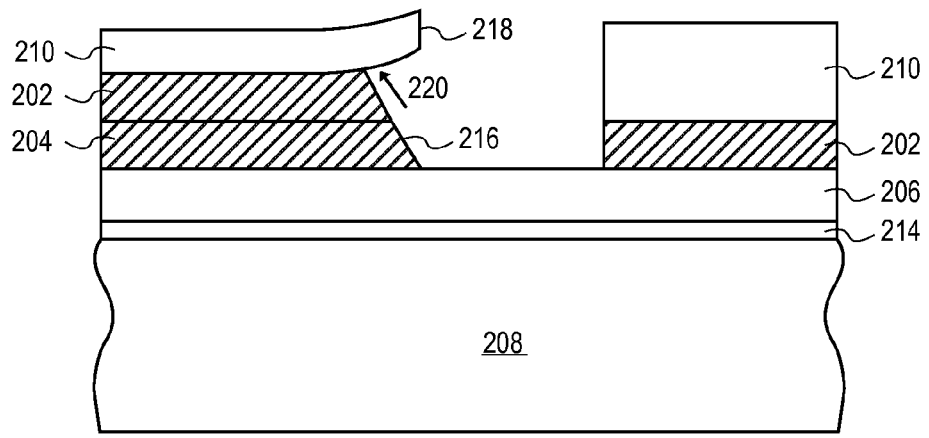
FIG. 2B illustrates a cross-sectional view of a stage in the fabrication of a back-contact solar cell, in accordance with an embodiment of the present invention.

Referring to FIG. 2B, N-type dopant source layer 202 and patterned P-type dopant source layer 204 are etched, in alignment with mask 210, to provide an arrangement where patterned P-type dopant source layer 204 is spaced apart from the portion of N-type dopant source layer 202 that is directly on material layer 206, as depicted in FIG. 2B. However, patterned P-type dopant source layer 204 may include a tapered sidewall 216, which may undesirably result from partial mask 210 lift-off 218 and/or undercut 220 of mask 206 during the etch process, as is also depicted in FIG. 2B.

Figure 2C:
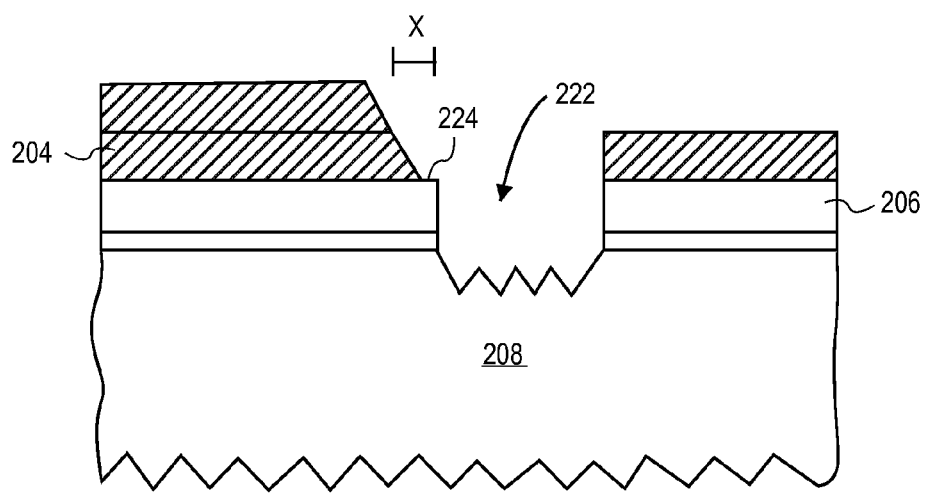
FIG. 2C illustrates a cross-sectional view of a stage in the fabrication of a back-contact solar cell, in accordance with an embodiment of the present invention.

Referring to FIG. 2C, further processing includes removal of mask 206 and formation of a trench 222 through material layer 206 and part way into substrate 208, using the remaining portions of patterned P-type dopant source layer 204 and N-type dopant source layer 202 as an etch mask. However, as depicted in FIG. 2C, the remaining portion of patterned P-type dopant source layer 204 may be recessed away from the very edge of the portion of material layer 206 directly adjacent trench 222 during the etch process. This may result in the formation of an exposed portion 224 of material layer 206 that is not covered by the remaining portion of patterned P-type dopant source layer 204. Exposed portion 224 of material layer 206 that is not covered by the remaining portion of patterned P-type dopant source layer 204 is referred to herein as a "ledge" feature, having a width X, which may be an undesirable feature for further processing.

Figure 2D:
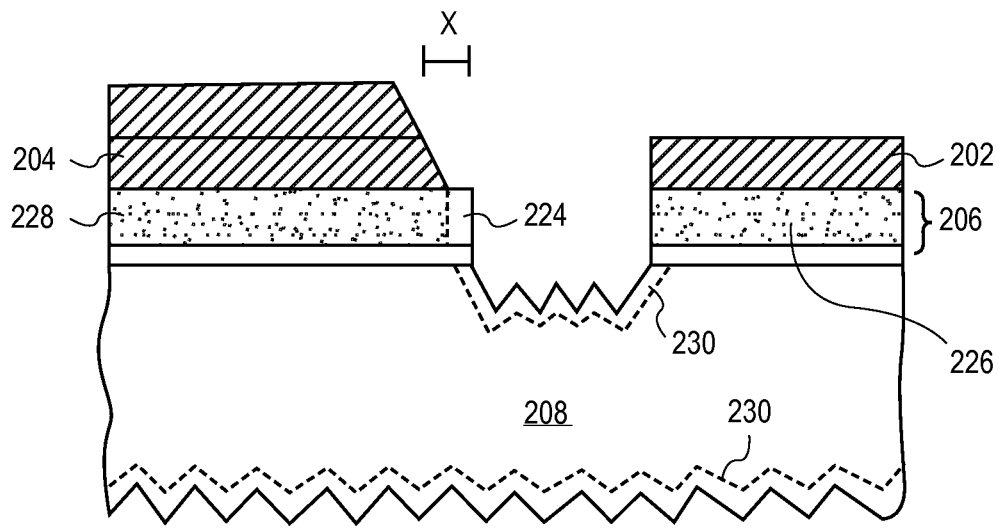
FIG. 2D illustrates a cross-sectional view of a stage in the fabrication of a back-contact solar cell, in accordance with an embodiment of the present invention.

Referring to FIG. 2D, the structure of FIG. 2C is heated or annealed to diffuse, from layers 202 and 204, dopants into material layer 206 to provide and N-type-doped material region 226 and a P-type-doped material region 228. However, exposed portion 224 of material layer 206 that is not covered by the remaining portion of patterned P-type dopant source layer 204, e.g. the ledge, may have a concentration of dopant less than the rest of P-type-doped material region 228 because layer 204 was recessed back from the edge of material layer 206. This variation in doping, where the end portion of P-type-doped material region 228 has a lower dopant concentration than the rest of P-type-doped material region 228 may have a negative impact on the performance of a solar cell ultimately formed therefrom. It is noted that, during the heating or annealing described above, N-type doped regions 230 may be formed in substrate 208 from a gaseous dopant precursor, as depicted in FIG. 2D.

Figure 2E:
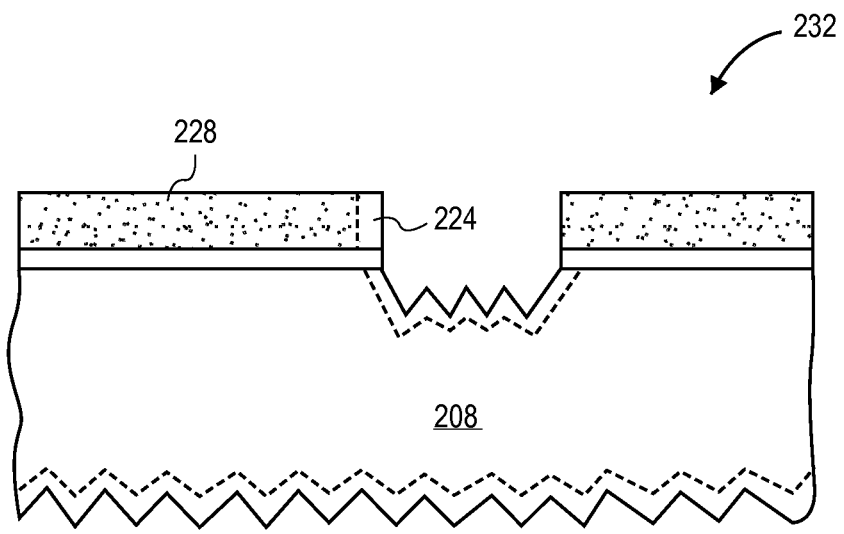
FIG. 2E illustrates a cross-sectional view of a stage in the fabrication of a back-contact solar cell, in accordance with an embodiment of the present invention.

Referring to FIG. 2E, a portion of a solar cell 232 with layers 204 and 202 removed still retains a signature of the ledge feature, namely portion 224 of P-type-doped material region 228. In an embodiment, portion 224 has a negative impact on a completed solar cell fabricated therefrom.

In an aspect of the present invention, a back-contact solar cell may not include a signature from a ledge feature. For example, FIG. 3 illustrates a cross-sectional view of a back-contact solar cell, in accordance with an embodiment of the present invention.

Figure 3:
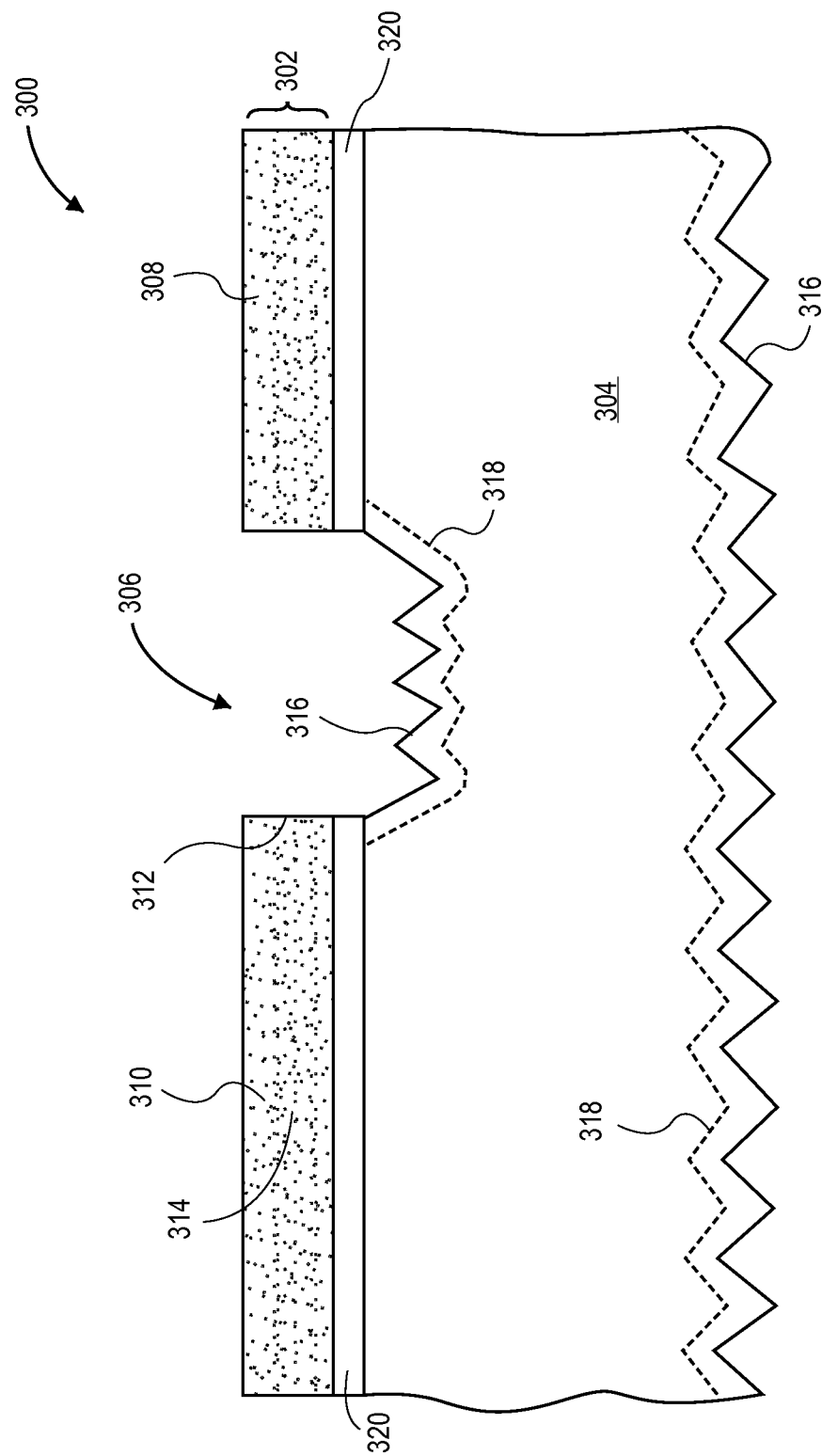
FIG. 3 illustrates a cross-sectional view of a back-contact solar cell, in accordance with an embodiment of the present invention.

Referring to FIG. 3, a back-contact solar cell 300 includes a material layer 302 disposed above a substrate 304. A trench 306 is disposed in material layer 302. Trench 306 separates an N-type region 308 and a P-type region 310 of material layer 302. P-type region 310 includes a dopant concentration 312 directly adjacent to trench 306 approximately equal to a dopant concentration 314 in the center of P-type region 310. That is, there is no ledge feature in P-type region 310.

In accordance with an embodiment of the present invention, material layer 302 of back-contact solar cell 300 is a poly-crystalline silicon layer, substrate 304 is a single-crystalline silicon substrate, P-type region 310 includes boron dopant impurity atoms, and N-type region includes phosphorous dopant impurity atoms. In an alternative embodiment, instead of forming a poly-crystalline material layer 302, a non-poly-crystalline absorbing material is formed instead such as, but not limited to, an amorphous layer, a polymer layer, or a multi-crystalline layer. In another alternative embodiment, instead of using a single-crystalline substrate 304, a multi-crystalline substrate is used in its place.

In an embodiment, trench 306 of back-contact solar cell 300 is disposed entirely through material layer 302 and partially into substrate 304, as depicted in FIG. 3. In one embodiment, surfaces of substrate 304 not covered by material layer 302 include a textured surface 316, as is also depicted in FIG. 3. In an embodiment, substrate 304 of back-contact solar cell 300 includes N-type dopants 318 at or near surfaces of substrate 304 not covered by material layer 302, as further depicted in FIG. 3.

In accordance with another embodiment of the present invention, back-contact solar cell 300 further includes a dielectric film 320 disposed directly between material layer 302 and substrate 304, as depicted in FIG. 3. In one embodiment, dielectric film 320 is composed of silicon dioxide and has a thickness approximately in the range of 1-2 nanometers. In a specific embodiment, dielectric film 320 is a tunnel oxide barrier layer film.

Figure 4:
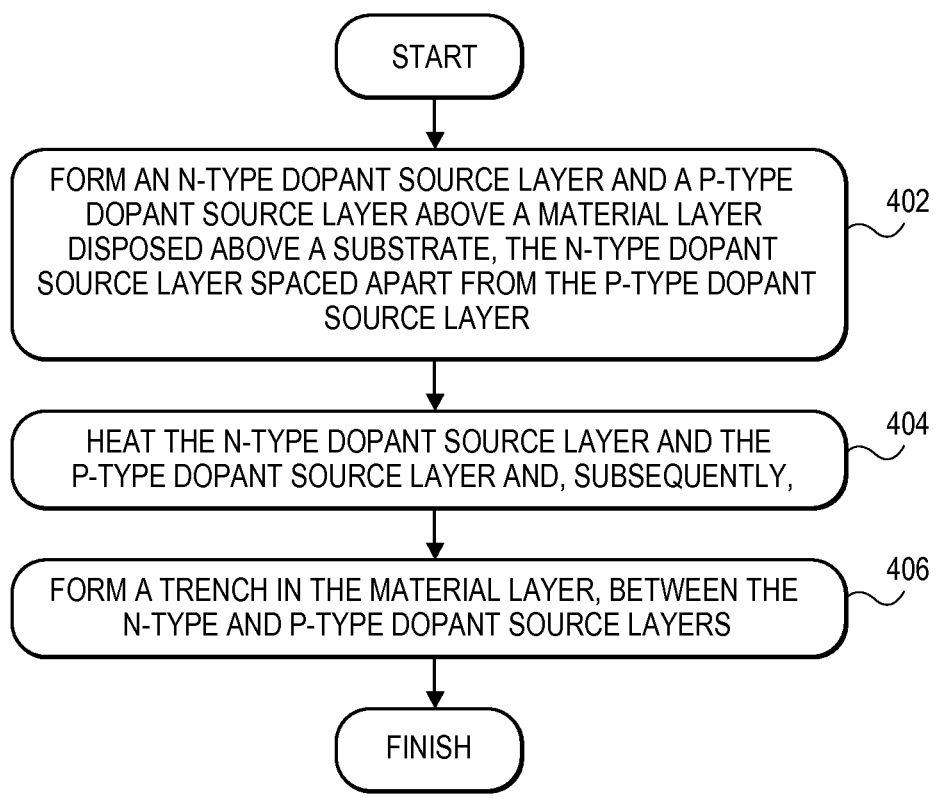
FIG. 4 illustrates a flowchart representing operations in a method of fabricating a back-contact solar cell, in accordance with an embodiment of the present invention.
Figure 5A:
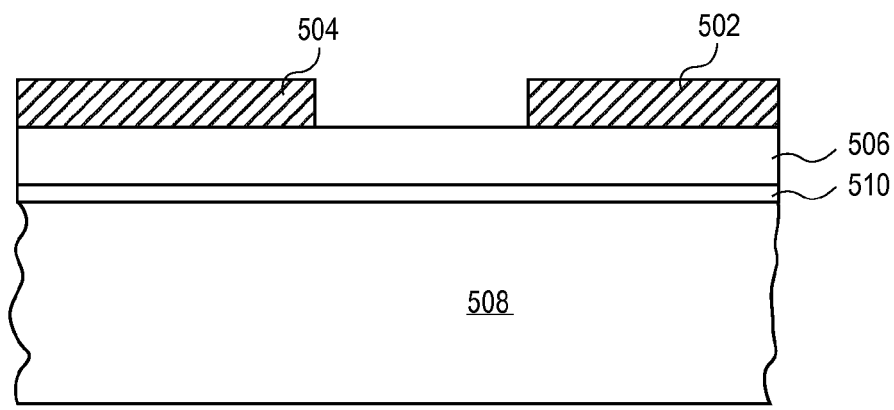
FIG. 5A illustrates a cross-sectional view of a stage in the fabrication of a back-contact solar cell, corresponding to operation 402 of the flowchart of FIG. 4, in accordance with an embodiment of the present invention.
Figure 5B:
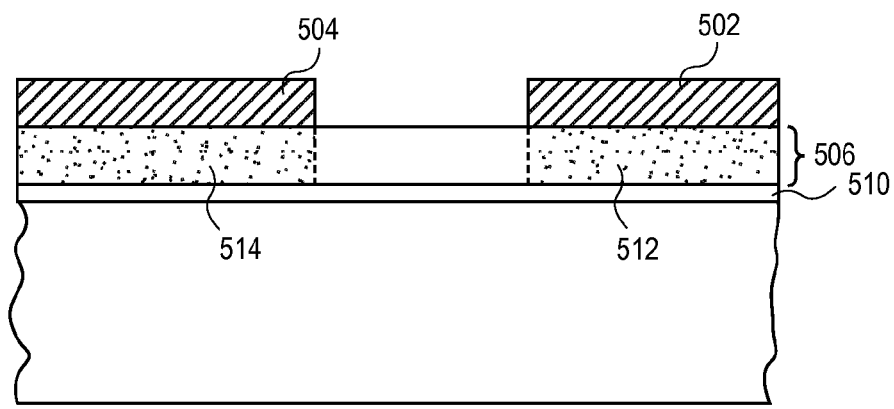
FIG. 5B illustrates a cross-sectional view of a stage in the fabrication of a back-contact solar cell, corresponding to operation 404 of the flowchart of FIG. 4, in accordance with an embodiment of the present invention.
Figure 5C:
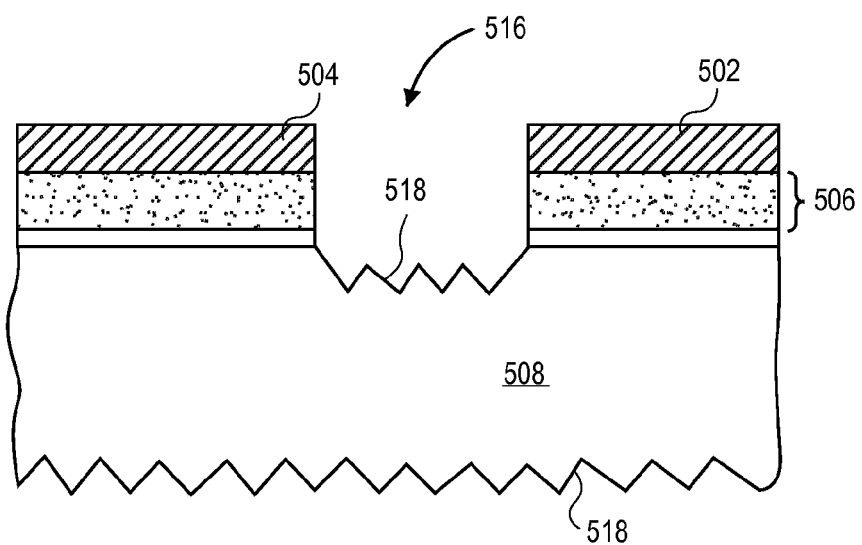
FIG. 5C illustrates a cross-sectional view of a stage in the fabrication of a back-contact solar cell, corresponding to operation 406 of the flowchart of FIG. 4, in accordance with an embodiment of the present invention.
Figure 5D:
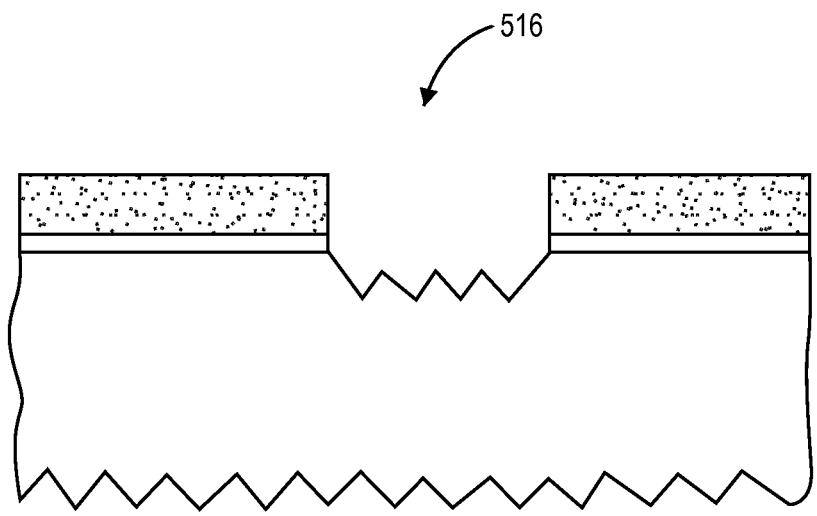
FIG. 5D illustrates a cross-sectional view of an additional stage in the fabrication of a back-contact solar cell, in accordance with an embodiment of the present invention.
Figure 5E:
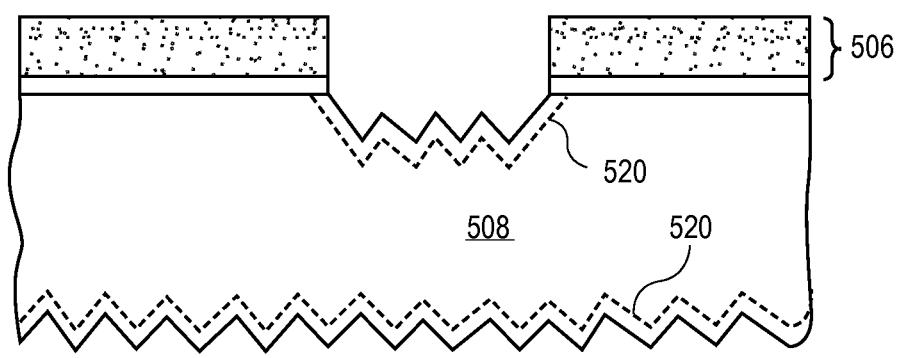
FIG. 5E illustrates a cross-sectional view of an additional stage in the fabrication of a back-contact solar cell, in accordance with an embodiment of the present invention.

In another aspect of the present invention, a back-contact solar cell may be fabricated to not include a ledge feature. For example, FIG. 4 illustrates a flowchart 400 representing operations in a method of fabricating a back-contact solar cell, in accordance with an embodiment of the present invention. FIGS. 5A-5C illustrate cross-sectional views of various stages in the fabrication of a back-contact solar cell, corresponding to operations of flowchart 400, in accordance with an embodiment of the present invention. FIGS. 5D and 5E illustrate cross-sectional views of various additional stages in the fabrication of a back-contact solar cell, in accordance with an embodiment of the present invention.

Referring to operation 402 of flowchart 400, and corresponding FIG. 5A, a method of fabricating a back-contact solar cell includes forming an N-type dopant source layer 502 and a P-type dopant source layer 504 above a material layer 506 disposed above a substrate 508. N-type dopant source layer 502 is spaced apart from P-type dopant source layer 504, as depicted in FIG. 5A.

In accordance with an embodiment of the present invention, forming N-type dopant source layer 502 and P-type dopant source layer 504 includes using an ink-jet deposition technique. In one embodiment, using the ink-jet deposition technique includes forming N-type dopant source layer 502 and P-type dopant source layer 504 at the same time. In one embodiment, using the ink-jet deposition technique includes forming N-type dopant source layer 502 and P-type dopant source layer 504 at different times. In an embodiment, forming N-type dopant source layer 502 and P-type dopant source layer 504 above material layer 506 disposed above substrate 508 includes forming a phosphorous-doped silicate glass layer and a boron-doped silicate glass layer, respectively, directly on a poly-crystalline silicon layer disposed above a single-crystalline silicon substrate. In an alternative embodiment, instead of forming a poly-crystalline material layer 506, a non-poly-crystalline absorbing material is formed instead such as, but not limited to, an amorphous layer, a polymer layer, or a multi-crystalline layer. In another alternative embodiment, instead of using a single-crystalline substrate 508, a multi-crystalline substrate is used in its place.

In an embodiment of the present invention, a dielectric film 510 is formed directly below material layer 506 and directly above substrate 508, as depicted in FIG. 5A. In one embodiment, dielectric film 510 is composed of silicon dioxide and has a thickness approximately in the range of 1-2 nanometers. In a specific embodiment, dielectric film 510 is a tunnel oxide barrier layer film.

Referring to operation 404 of flowchart 400, and corresponding FIG. 5B, the method of fabricating a back-contact solar cell further includes heating N-type dopant source layer 502 and P-type dopant source layer 504.

In accordance with an embodiment of the present invention, heating N-type dopant source layer 502 and P-type dopant source layer 504 includes transferring N-type dopants and P-type dopants, respectively, into portions 512 and 514, respectively, of material layer 506, as depicted in FIG. 5B. In one embodiment, heating N-type dopant source layer 502 and P-type dopant source layer 504 includes heating at a temperature of approximately 950 degrees Celsius. In one embodiment, heating N-type dopant source layer 502 and P-type dopant source layer includes hardening both N-type dopant source layer 502 and P-type dopant source layer 504. In a specific embodiment, hardening both N-type dopant source layer 502 and P-type dopant source layer 504 increases the etch resistance of N-type dopant source layer 502 and P-type dopant source layer 504 during a subsequent trench formation, such as the trench formation described below.

Referring to operation 406 of flowchart 400, and corresponding FIG. 5C, the method of fabricating a back-contact solar cell further includes, subsequent to the heating of operation 404, forming a trench 516 in material layer 506, between N-type and P-type dopant source layers 502 and 504, respectively.

In accordance with an embodiment of the present invention, forming trench 516 in material layer 506 includes forming a trench entirely through material layer 506 and partially into substrate 508, trench 516 having a width approximately equal to the spacing of N-type and P-type dopant source layers 502 and 504, respectively, as depicted in FIG. 5C. In one embodiment, forming trench 516 includes texturing, with a textured surface 518, surfaces of substrate 508 not covered by material layer 506, as is also depicted in FIG. 5C. In a specific embodiment, the texturing includes using a wet etch technique including a hydroxide-based wet etchant.

In an embodiment, referring to FIG. 5D, a method of fabricating a back-contact solar cell further includes, subsequent to forming trench 516, removing N-type dopant source layer 502 and P-type dopant source layer 504. In one embodiment, removing N-type dopant source layer 502 and P-type dopant source layer 504 includes using a hydrofluoric acid wet etch technique.

In an embodiment, referring to FIG. 5E, a method of fabricating a back-contact solar cell further includes, subsequent to removing N-type dopant source layer 502 and P-type dopant source layer 504, heating substrate 508. In one embodiment, heating substrate 508 includes heating in the presence of a gaseous N-type dopant source and doping, with the gaseous N-type dopant source, substrate 508 at or near surfaces of substrate 508 not covered by material layer 506, as depicted by the dopant regions 520 of FIG. 5E.

Thus, methods of fabricating back-contact solar cells and devices thereof have been disclosed. In accordance with an embodiment of the present invention, a method of fabricating a back-contact solar cell includes forming an N-type dopant source layer and a P-type dopant source layer above a material layer disposed above a substrate. The N-type dopant source layer is spaced apart from the P-type dopant source layer. The N-type dopant source layer and the P-type dopant source layer are heated. Subsequently, a trench is formed in the material layer, between the N-type and P-type dopant source layers. In an additional embodiment, subsequent to forming the trench, the N-type dopant source layer and the P-type dopant source layer are removed. In another additional embodiment, subsequent to removing the N-type dopant source layer and the P-type dopant source layer, the substrate is heated.

What is claimed is:

1. A method of fabricating a back-contact solar cell, the method comprising:
    forming an N-type dopant source layer and a P-type dopant source layer above a material layer disposed above a semiconductor substrate, the N-type dopant source layer spaced apart from, and not in contact with, the P-type dopant source layer;
    heating the N-type dopant source layer and the P-type dopant source layer; and, subsequently,
    forming a trench in the material layer, between the N-type and P-type dopant source layers, the trench exposing a portion of the semiconductor substrate.

2. The method of claim 1, further comprising:
    subsequent to forming the trench, removing the N-type dopant source layer and the P-type dopant source layer.

3. The method of claim 2, further comprising:
    subsequent to removing the N-type dopant source layer and the P-type dopant source layer, heating the semiconductor substrate.

4. The method of claim 1, wherein forming the N-type dopant source layer and the P-type dopant source layer comprises using an ink jet deposition technique.

5. The method of claim 4, wherein using the ink jet deposition technique comprises forming the N-type dopant source layer and the P-type dopant source layer at the same time.

6. The method of claim 4, wherein using the ink jet deposition technique comprises forming the N-type dopant source layer and the P-type dopant source layer at different times.

7. The method of claim 1, wherein forming the N-type dopant source layer and the P-type dopant source layer above the material layer disposed above the semiconductor substrate comprises forming a phosphorous-doped silicate glass layer and a boron-doped silicate glass layer, respectively, directly on a poly-crystalline silicon layer disposed above a single-crystalline silicon substrate.

8. The method of claim 1, wherein heating the N-type dopant source layer and the P-type dopant source layer comprises transferring N-type dopants and P-type dopants, respectively, into portions of the material layer.

9. The method of claim 8, wherein heating the N-type dopant source layer and the P-type dopant source layer comprises heating at a temperature of 950 degrees Celsius.

10. The method of claim 8, wherein heating the N-type dopant source layer and the P-type dopant source layer comprises hardening both the N-type dopant source layer and the P-type dopant source layer.

11. The method of claim 1, wherein forming the trench comprises texturing, with a textured surface, surfaces of the semiconductor substrate not covered by the material layer.

12. The method of claim 2, wherein removing the N-type dopant source layer and the P-type dopant source layer comprises using a hydrofluoric acid wet etch technique.

13. The method of claim 3, wherein heating the semiconductor substrate comprises heating in the presence of a gaseous N-type dopant source and doping, with the gaseous N-type dopant source, the semiconductor substrate at or near surfaces of the semiconductor substrate not covered by the material layer.

14. The method of claim 1, wherein forming the trench comprises forming the trench partially into the semiconductor substrate.

* * * * *